(12) United States Patent
Kuroda et al.

(10) Patent No.: US 11,856,707 B2
(45) Date of Patent: Dec. 26, 2023

(54) AUTOMATIC BACKUP PIN ARRANGEMENT SYSTEM FOR COMPONENT MOUNTING MACHINE

(71) Applicant: FUJI CORPORATION, Chiryu (JP)

(72) Inventors: Hideya Kuroda, Toyota (JP); Hiroyoshi Sugita, Kariya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/635,317

(22) PCT Filed: Sep. 6, 2019

(86) PCT No.: PCT/JP2019/035225
§ 371 (c)(1),
(2) Date: Feb. 14, 2022

(87) PCT Pub. No.: WO2021/044620
PCT Pub. Date: Mar. 11, 2021

(65) Prior Publication Data
US 2022/0295681 A1    Sep. 15, 2022

(51) Int. Cl.
*H05K 13/08*   (2006.01)
*H05K 13/04*   (2006.01)
*H05K 13/00*   (2006.01)

(52) U.S. Cl.
CPC ..... *H05K 13/0882* (2018.08); *H05K 13/0061* (2013.01); *H05K 13/0404* (2013.01); *H05K 13/0408* (2013.01)

(58) Field of Classification Search
CPC .......... H05K 13/0882; H05K 13/0061; H05K 13/0404; H05K 13/0408
See application file for complete search history.

(56) References Cited

U.S. PATENT DOCUMENTS 5,218,753 A * 6/1993 Suzuki ............... H05K 13/0069
                                                    29/760
6,988,612 B1 * 1/2006 Kabeshita .......... H05K 13/0061
                                                    198/817
(Continued)

FOREIGN PATENT DOCUMENTS

EP     0271006 A2 *  6/1988
EP     1509075 A2 *  2/2005   ......... H05K 13/0061
(Continued)

OTHER PUBLICATIONS

International Search Report dated Dec. 3, 2019 in PCT/JP2019/035225 filed on Sep. 6, 2019, 1 page.

*Primary Examiner* — Jeffrey T Carley
(74) *Attorney, Agent, or Firm* — Oblon, McClelland, Maier & Neustadt, L.L.P.

(57) ABSTRACT

An automatic backup pin arrangement operation includes a backup plate facing a lower surface of circuit board where backup pins stored in a stock areas are picked up with an XY-robot to be automatically arranged at positions of the backup plate designated in a production job. In a case where there is no free space in the stock areas for an unnecessary backup pin removed from the backup plate to be placed when a production job for changing the arrangement of the backup pins is switched, at least a part of a region of the backup plate facing a lower surface of the circuit board, which does not interfere with a mounted component on a lower surface side of the circuit board, is used as retraction area, and the unnecessary backup pin that cannot be retracted to the stock area is retracted to the retraction area.

5 Claims, 6 Drawing Sheets

(56) References Cited

U.S. PATENT DOCUMENTS

| | | | | |
|---|---|---|---|---|
| 9,497,895 B2* | 11/2016 | Yamashita | ......... | H05K 13/0061 |
| 10,973,160 B2* | 4/2021 | Kawai | ................ | H05K 13/0061 |
| 2011/0268346 A1* | 11/2011 | Ito | ...................... | H05K 13/0069 |
| | | | | 361/767 |
| 2015/0231744 A1* | 8/2015 | Okuda | ................. | G01N 21/956 |
| | | | | 356/244 |

FOREIGN PATENT DOCUMENTS

| | | | | |
|---|---|---|---|---|
| JP | 2000114793 A | * | 4/2000 | |
| JP | 2008-211051 A | | 9/2008 | |
| JP | 2011-14627 A | | 1/2011 | |
| JP | 2011009470 A | * | 1/2011 | |
| JP | 2013016584 A | * | 1/2013 | |
| JP | 2014-203966 A | | 10/2014 | |
| JP | 2014203966 A | * | 10/2014 | |

* cited by examiner

AUTOMATIC BACKUP PIN ARRANGEMENT SYSTEM FOR COMPONENT MOUNTING MACHINE

TECHNICAL FIELD

The present specification discloses a technique related to an automatic backup pin arrangement system for a component mounting machine in which a function of automatically arranging backup pins at positions designated in a production job for holding a circuit board on which a component is mounted from below is installed.

BACKGROUND ART

Since a component mounting board in recent years has become thinner and has been easier to bend, in a case where a component is mounted on a circuit board by a component mounting machine, as described in Patent Literature 1 (JP-A-2011-14627), the circuit board is held by backup pins from below to prevent the circuit board from bending. The component mounting machine of Patent Literature 1 includes a backup plate (backup base) on which backup pins are placed, uses at least a part of a region of the backup plate, which does not face the circuit board, as a stock area for storing the backup pins, picks up the backup pins stored in the stock area using a mounting head, and automatically arranges the backup pins on the backup plate.

PATENT LITERATURE

Patent Literature 1: JP-A-2011-14627

BRIEF SUMMARY

Technical Problem

Incidentally, it is necessary to change an arrangement of backup pins whenever a production job is switched to change a size, a shape, or the like of a circuit board on which a component is mounted, the number of backup pins to be used is increased or decreased by the change of the arrangement of the backup pins, and thereby the number of backup pins (unused backup pins) to be left in a stock area is also increased or decreased.

In addition, the stock area on the backup plate may be narrowed depending on the size or the shape of the circuit board when the production job is switched, and when the stock area is narrowed, the number of backup pins that can be stored in the stock area decreases. Therefore, the number of unused backup pins may be larger than the number of backup pins that can be stored in the stock area.

As a countermeasure against this, in the above Patent Literature 1, in a case where the stock area on the backup plate is insufficient, a spare stock area is provided in another place other than the backup plate, so that an operator removes unnecessary backup pins from the backup plate and performs an operation of collecting the unnecessary backup pins in the spare stock area. Since this operation is performed manually by the operator, it takes time to perform the switching operation of the production job, so that there has been a problem that the productivity is decreased.

Solution to Problem

In order to solve the above-mentioned problems, an automatic backup pin arrangement system for a component mounting machine, includes: a backup plate in which backup pins for holding a circuit board on which a component is mounted, from below are placed; and an XY-robot configured to perform a component mounting operation of mounting the component on the circuit board and an automatic backup pin arrangement operation of automatically arranging the backup pins on the backup plate. When performing the automatic backup pin arrangement operation, the XY-robot uses at least a part of a region of the backup plate not facing a lower surface of the circuit board, as a stock area for storing the backup pins, picks up the backup pins stored in the stock area, and automatically arranges the backup pins at positions of the backup plate designated in a production job. When there is no free space where an unnecessary backup pin removed from the backup plate is retracted to the stock area when a production job is switched for changing the arrangement of the backup pins, the XY-robot uses, as a retraction area, at least a part of a region of the backup plate facing a lower surface of the circuit board, which does not interfere with a mounted component on a lower surface side of the circuit board, and retracts the unnecessary backup pin that cannot be retracted to the stock area to the retraction area.

In this configuration, when the number of backup pins not used when the production job is switched is larger than the number of backup pins that can be stored in the stock area, at least a part of the region of the backup plate facing the lower surface of the circuit board, which does not interfere with the mounted component on the lower surface side of the circuit board, is used as the retraction area. Therefore, the unnecessary backup pins that cannot be retracted to the stock area can be retracted to the retraction area by the XY-robot. Therefore, it is unnecessary for the operator to perform a troublesome operation in which the unnecessary backup pins are removed from the backup plate when the production job is switched to store the same in a spare stock area provided in another place other than the backup plate, so that the productivity can be improved.

DESCRIPTION OF EMBODIMENTS

Figure 1:
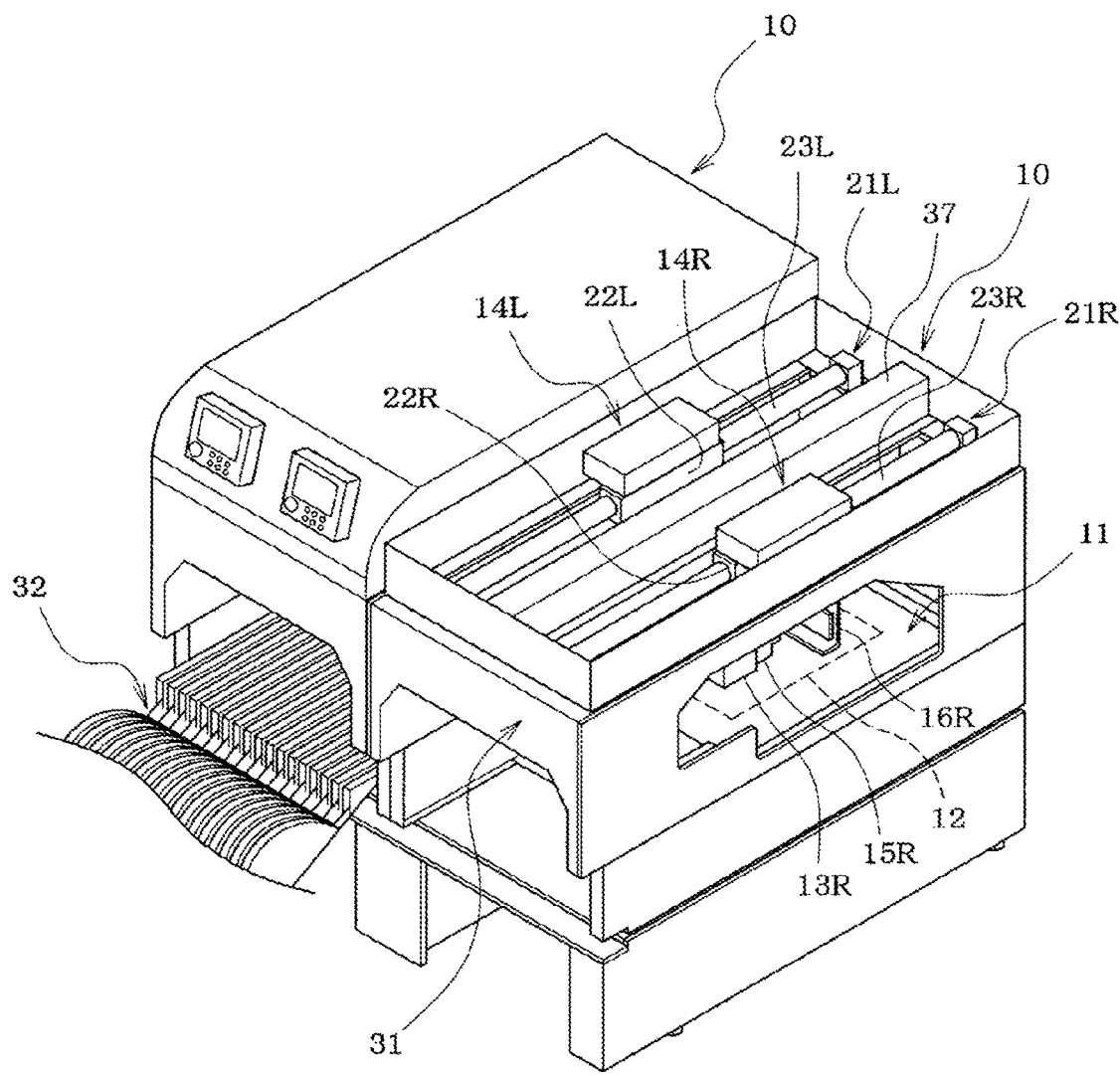
FIG. 1 is a perspective view illustrating an arrangement of two component mounting machines according to an embodiment in which a feeder, an upper cover, and the like are removed from one component mounting machine.
Figure 1:
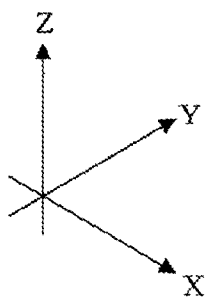
Figure 2:
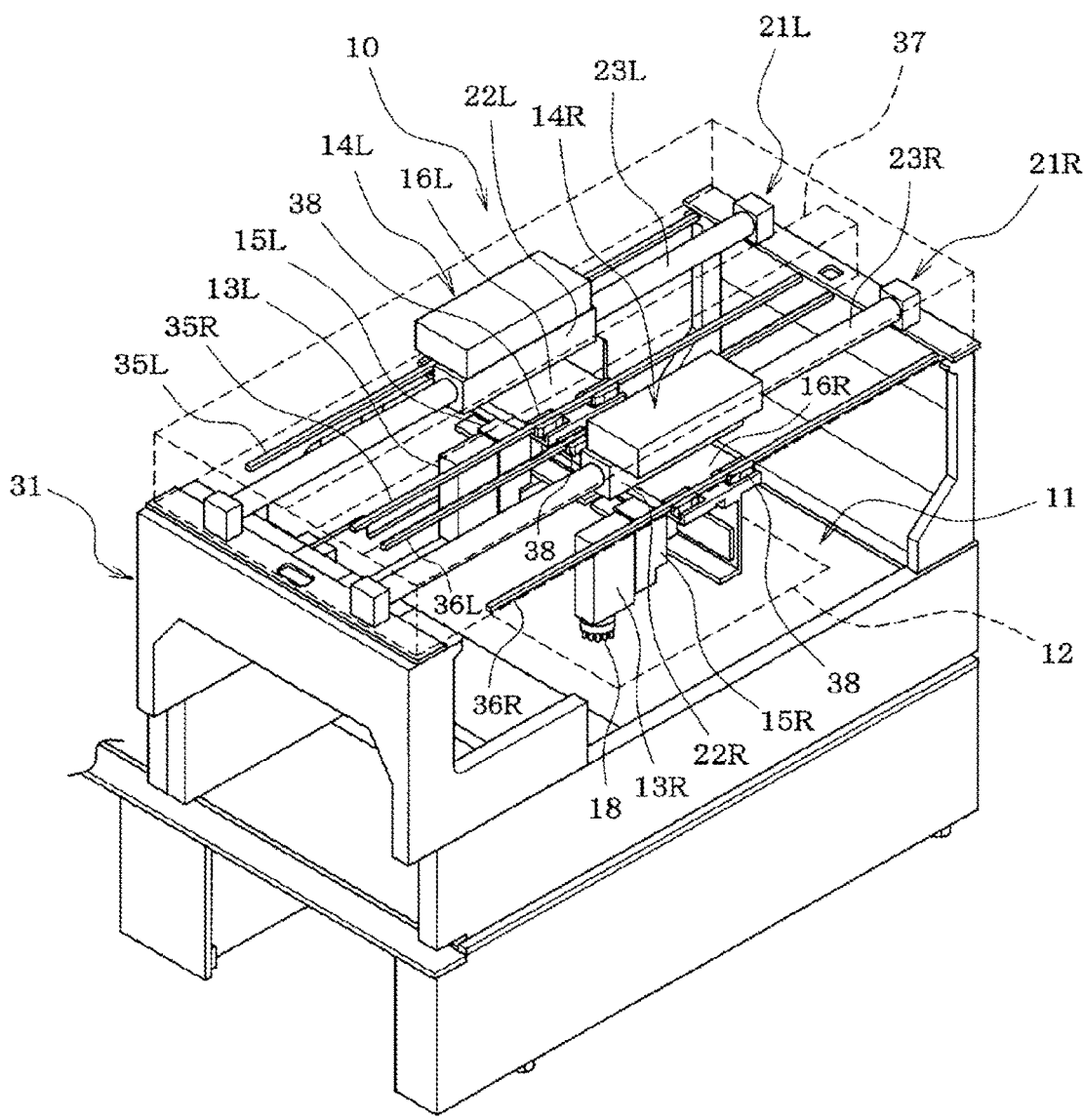
FIG. 2 is a perspective view of the component mounting machine in which the feeder, the upper cover, and the like are removed.
Figure 2:
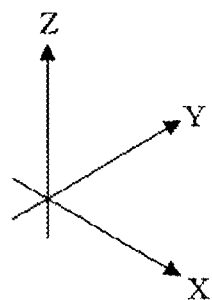
Figure 3:
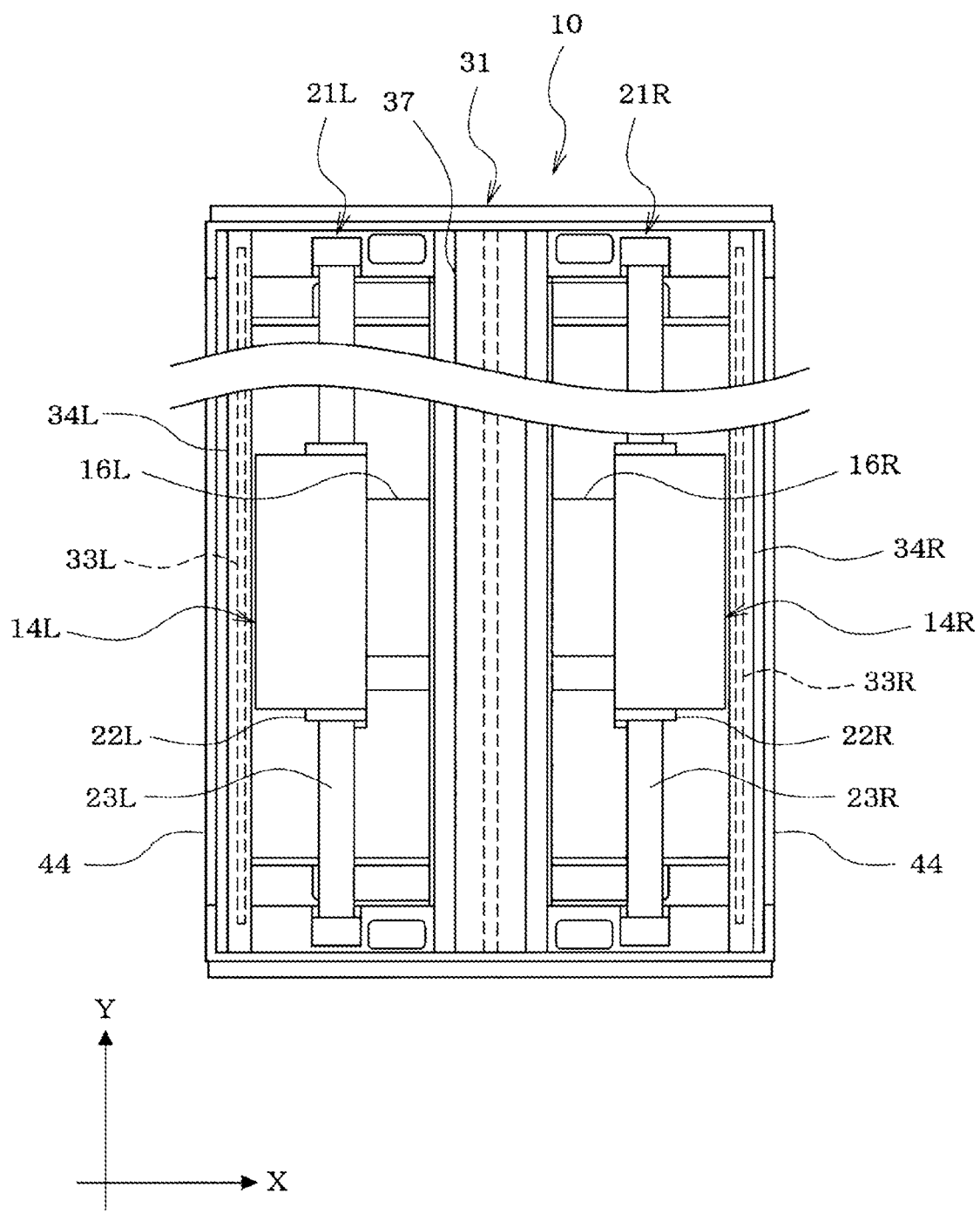
FIG. 3 is a plan view of the component mounting machine illustrated in FIG. 2.

Hereinafter, an embodiment disclosed in the present specification will be described. First, a configuration of component mounting machine 10 will be described with reference to FIGS. 1 to 3. Multiple component mounting machines 10 are arranged in a component mounting line for producing a component mounting board. FIG. 1 illustrates an example in which two component mounting machines 10 are installed.

Each component mounting machine 10 has a configuration in which two mounting heads 13L and 13R (refer to FIG. 2) for mounting components on circuit board 12 conveyed by conveyor 11, and two XY-robots 14L and 14R for moving two mounting heads 13L and 13R separately in X-direction, which is a conveyance direction of circuit board 12, and in Y-direction which is a direction orthogonal to X-direction are installed.

Two XY-robots 14L and 14R have the same configuration and the same size, and are configured by combining two X-slides 15L and 15R for separately moving two mounting heads 13L and 13R in X-direction, and two Y-slides 16L and 16R for separately moving X-slides 15L and 15R in Y-direction. Two XY-robots 14L and 14R are arranged such that two Y-slides 16L and 16R move, in Y-direction, movable areas AL and AR (movable area AL on a board loading side and movable area AR on a board unloading side illustrated in FIG. 5) different in X-direction, and each of Y-slides 16L and 16R supports each of X-axis driving devices 17L and 17R (refer to FIG. 6), which is a driving source for moving each of X-slides 15L and 15R in X-direction, while supporting each of X-slides 15L and 15R.

Figure 5:
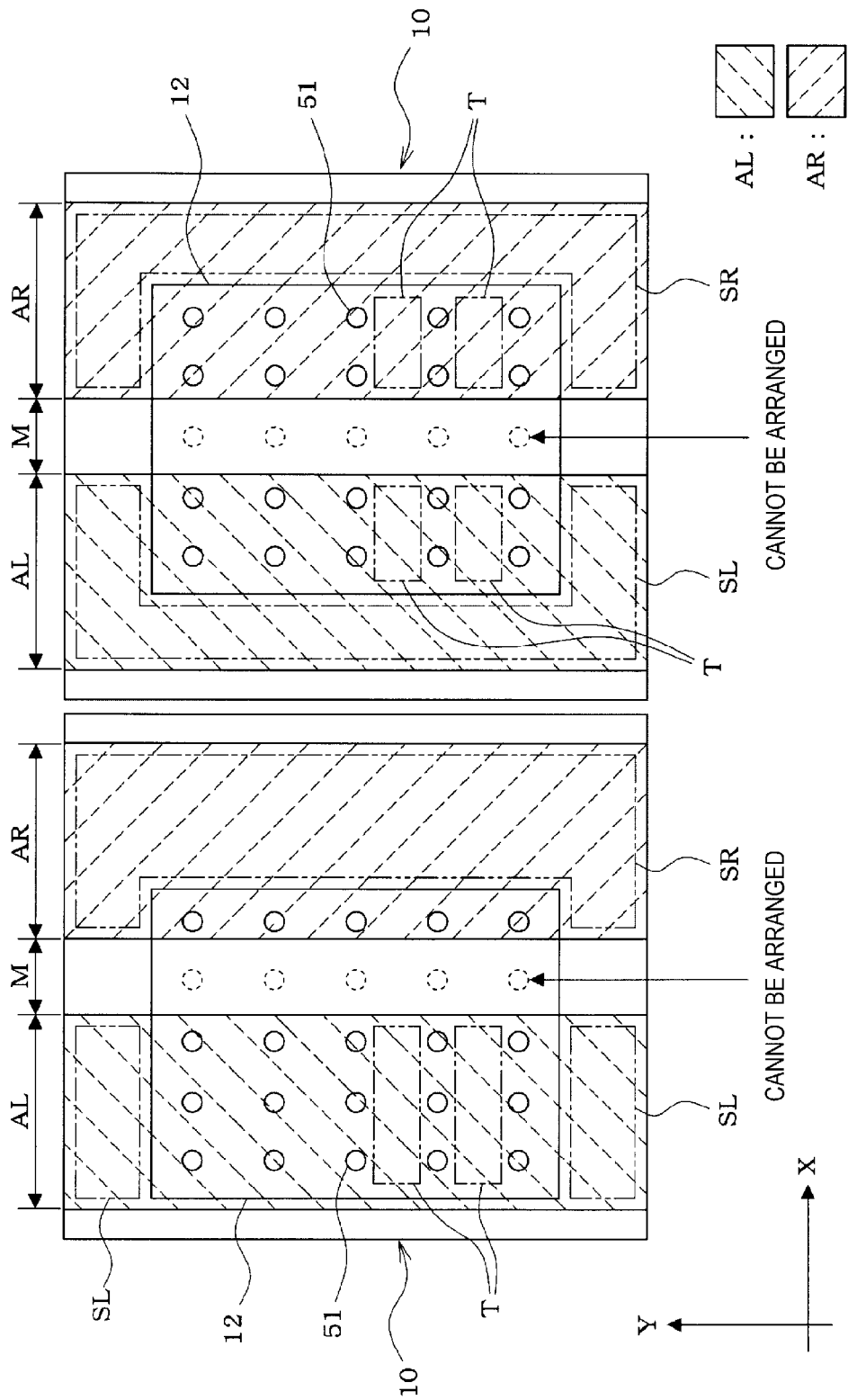
FIG. 5 is a plan view for explaining a positional relationship between a movable area of two XY-robots of each of adjacent component mounting machines, a conveyance stop position of a circuit board, a stock area, and a retraction area.
Figure 6:
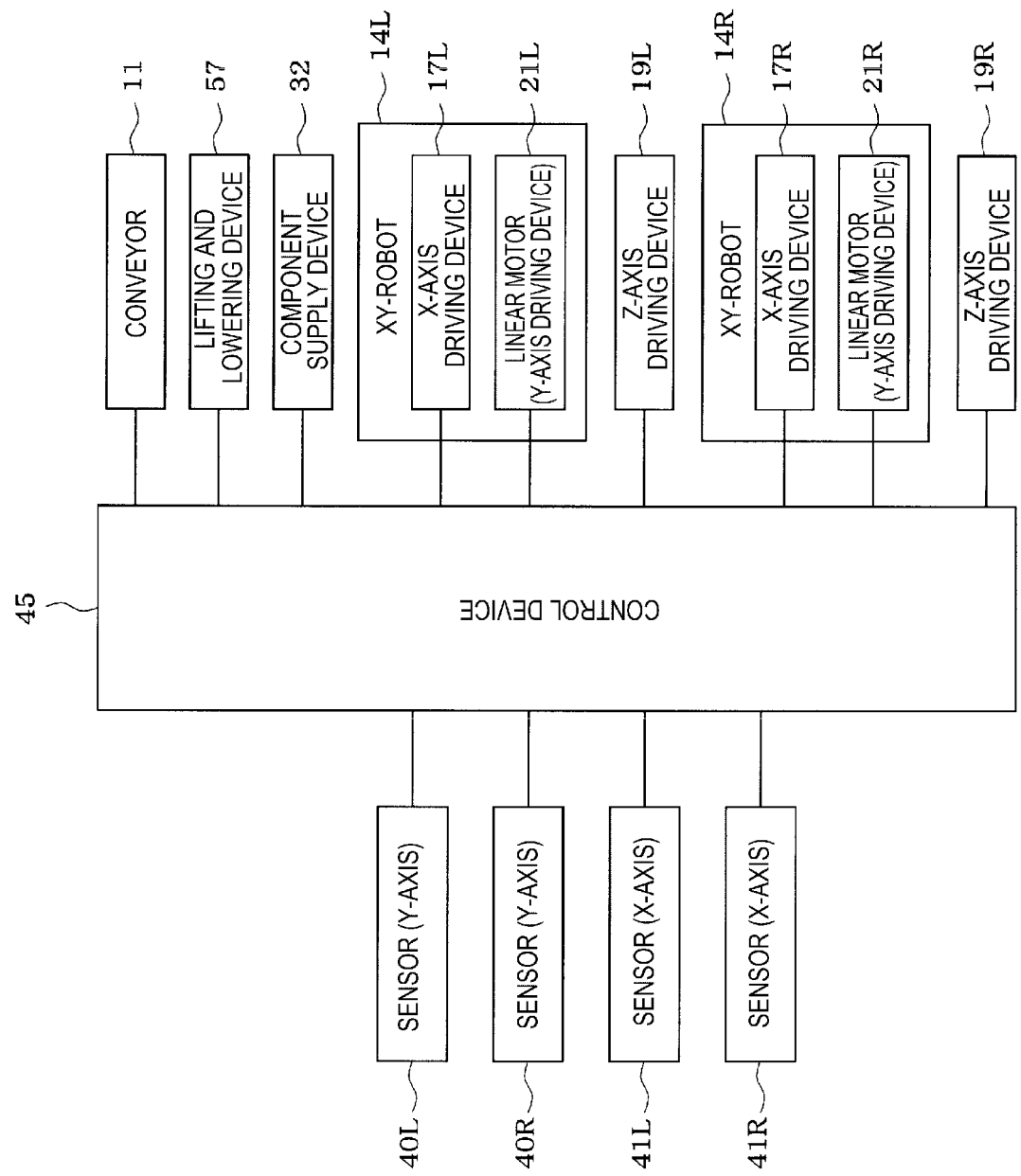
FIG. 6 is a block diagram illustrating a configuration of a control system of a component mounting machine.

In this case, as illustrated in FIG. 5, movable areas AL and AR (movable area AL on the board loading side and movable area AR on the board unloading side) in which two XY-robots 14L and 14R can move are located apart in X-direction which is the conveyance direction of circuit board 12, so that area M outside the movement range exists between movable areas AL and AR of two XY-robots 14L and 14R, and a component mounting operation and an automatic backup pin arrangement operation described later can be performed only in movable areas AL and AR.

Each of X-axis driving devices 17L and 17R is configured by using, for example, a feeding screw device, a linear motor, or the like. In addition, each of mounting heads 13L and 13R is supported and a mark imaging camera (not illustrated) for imaging a board mark of circuit board 12 is supported by each of X-slides 15L and 15R supported by each of Y-slides 16L and 16R.

Each of mounting heads 13L and 13R holds one or multiple suction nozzles 18 (refer to FIG. 2) for picking up of a component, and is provided with Z-axis driving devices 19L and 19R (refer to FIG. 6) for lowering/lifting each suction nozzle 18 during a component pickup operation or a component mounting operation. Each of mounting heads 13L and 13R may be a rotary-type mounting head or may be a mounting head that does not rotate.

On the other hand, a Y-axis driving device serving as a driving source for moving each of Y-slides 16L and 16R in Y-direction is configured by using linear motors 21L and 21R. In each of two linear motors 21L and 21R, each of shaft-type stators 23L and 23R extends in parallel with Y-direction, both end portions of each of stators 23L and 23R in Y-direction are supported by mounting machine body 31, and each of Y-slides 16L and 16R is attached to each of movable elements 22L and 22R, which linearly moves along each of stators 23L and 23R. A position of each of linear motors 21L and 21R in X-direction is a position corresponding to a center of each of Y-slides 16L and 16R in a width in X-direction. In the present embodiment, each of linear motors 21L and 21R is a shaft-type linear motor, but may be a flat-type linear motor. In addition, the Y-axis driving device may be configured by using a feeding screw device instead of the linear motor.

Mounting machine body 31 supporting both end portions of stators 23L and 23R of each of linear motors 21L and 21R is a box-type structure configured to constitute a framework of component mounting machine 10, a conveyor 11 for conveying circuit board 12 in X-direction is disposed inside the body, and two mounting heads 13L and 13R move above conveyor 11 in XY-directions. A space for setting component supply device 32 (refer to FIG. 1), such as a tape feeder or a tray feeder, for supplying components is provided on a front surface side of mounting machine body 31.

In order to measure positional information (Y-coordinate) of each of Y-slides 16L and 16R in Y-direction, which is positional information (Y-coordinate) of each of mounting heads 13L and 13R in Y-direction, two linear scales 33L and 33R (refer to FIG. 3) are provided on mounting machine body 31 so as to extend parallel to Y-direction. Each of linear scales 33L and 33R may be of any-type, for example, such as a magnetic-type, a photoelectric-type (optical-type), or an electromagnetic induction-type.

Each of guide rails 35R and 36L (refer to FIG. 2) for guiding an inner end portion of each of Y-slides 16L and 16R in Y-direction is attached to a lower surface side of middle frame 37 (refer to FIGS. 1 to 3) provided in a beam shape at a center portion (between two XY-robots 14L and 14R) of mounting machine body 31. Guide members 38 (refer to FIG. 1) slidably fitted into each of guide rails 35L, 35R, 36L, and 36R are provided on left and right both end portions of each of Y-slides 16L and 16R.

Each of sensors 40L and 40R (refer to FIG. 6) for reading the positional information of each of Y-slides 16L and 16R in Y-direction is provided at a position among each of Y-slides 16L and 16R, where the positional information of each of Y-slides 16L and 16R in Y-direction can be read from each of linear scales 33L and 33R.

In order to measure the positional information (X-coordinate) of each of X-slides 15L and 15R in X-direction, which is the positional information (X-coordinate) of each of mounting heads 13L and 13R in X-direction, each of sensors 41L and 41R (refer to FIG. 6) is provided. Although a configuration for measuring the positional information of each of X-slides 15L and 15R in X-direction is not illustrated, for example, each linear scale may be provided on each of Y-slides 16L and 16R along X-direction, which is the movement direction of each of X-slides 15L and 15R, and each of sensors 41L and 41R for reading the positional information of each of X-slides 15L and 15R in X-direction from each linear scale may be provided on each of X-slides 15L and 15R. Alternatively, in a case where a feeding screw device is used as each of X-axis driving devices 17L and 17R for moving each of X-slides 15L and 15R in X-direction, the positional information (X-coordinate of mounting heads 13L and 13R) of each of X-slides 15L and 15R in X-direction may be calculated from a count value by counting output pulses of encoders (sensors 41L and 41R) provided in a motor of the feeding screw device.

Figure 4:
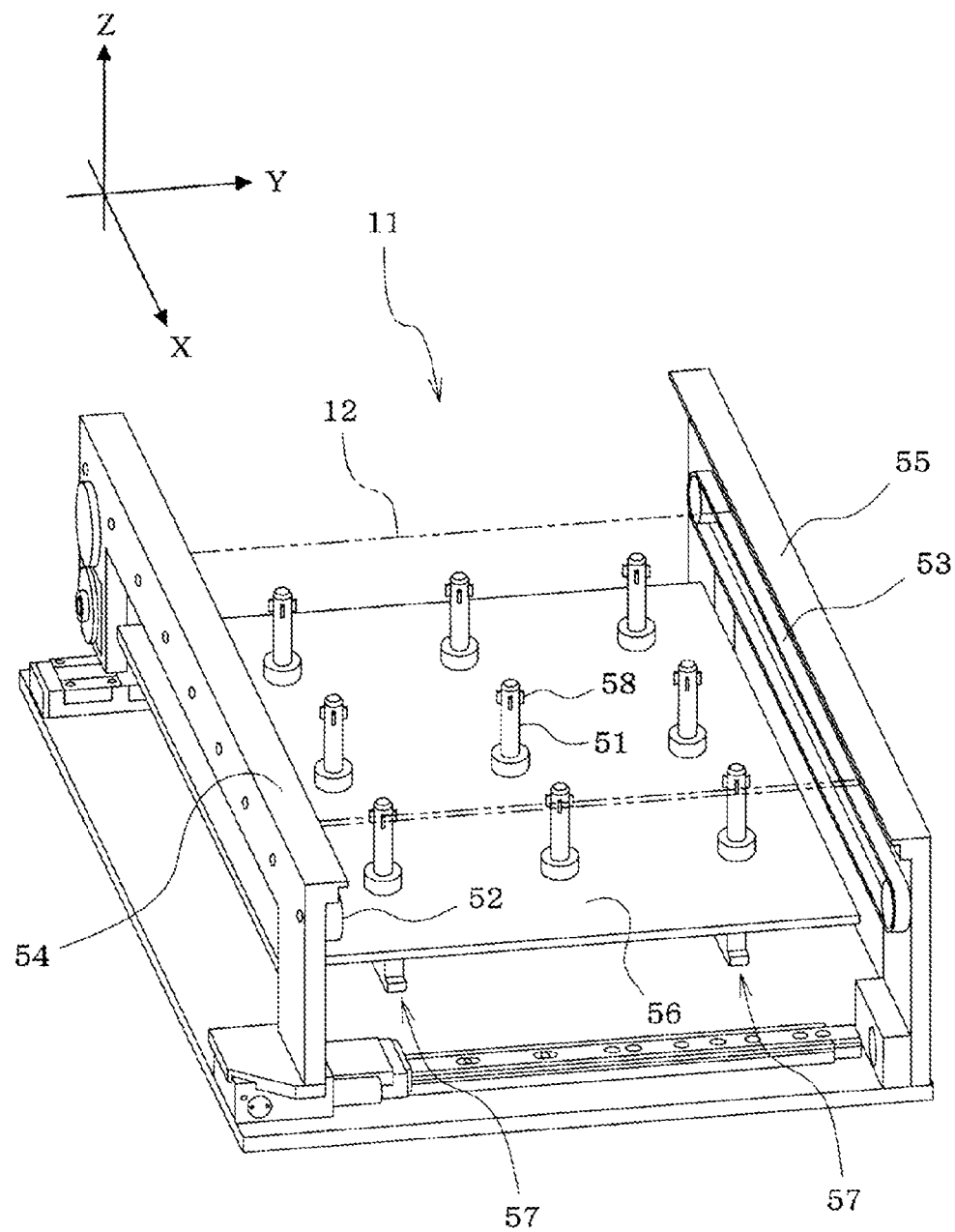
FIG. 4 is a perspective view illustrating a positional relationship among a conveyor, a backup plate, and backup pins.

Next, a configuration of conveyor 11 will be described with reference to FIG. 4. Conveyor belts 52 and 53 are arranged in parallel with the conveyance direction of circuit board 12 so as to place and convey both side portions of circuit board 12, rail 55 holding one conveyor belt 53 is a reference rail of which position is fixed, and rail 54 holding other conveyor belt 52 is a movable rail that moves in a width direction in accordance with a width of circuit board 12.

Backup plate 56 on which multiple backup pins 51 are placed is provided horizontally on conveyor 11. Backup plate 56 is formed of a magnetic material such as iron, so that backup pin 51 is picked up and held on backup plate 56 by a magnet (not illustrated) provided at a lower portion of backup pin 51. Backup plate 56 is configured to be lifted and lowered by lifting and lowering device 57 so that backup plate 56 lifts to an upper limit position when clamping circuit board 12 that has been loaded, and backup plate 56 lowers to a lower limit position when releasing the clamping of circuit board 12.

In the present embodiment, a size of backup plate 56 is formed larger than a size of circuit board 12, stock areas SL and SR for storing backup pins 51 are provided in a region (region protruding from directly below circuit board 12) that does not face a lower surface of circuit board 12 and in a range of movable areas AL and AR of XY-robots 14L and 14R in backup plate 56, so that at least the number of backup pins 51 which is required for the arrangement of backup pins 51 designated in the production job can be stored in stock areas SL and SR.

In addition, in the present embodiment, multiple engagement protrusions 58 are provided at equal angular intervals on an upper outer periphery of backup pin 51. When XY-robots 14L and 14R automatically arrange backup pins 51 on backup plate 56, engagement protrusions 58 of backup pin 51 are engaged and held in a bayonet engagement manner by engagement holding tools (not illustrated) exchangeably attached to mounting heads 13L and 13R of XY-robots 14L and 14R. In addition, backup pin 51 may be clamped by a chuck (not illustrated) exchangeably attached to mounting heads 13L and 13R.

Control device 45 for controlling an operation of each component mounting machine 10 of the component mounting line is configured by one or multiple computers (CPUs), controls a board conveyance operation of conveyor 11, moves each of mounting heads 13L and 13R separately in XY-directions by each of XY-robot 14L and 14R, and controls the component pickup operation of picking up a component supplied from component supply device 32 by suction nozzle 18 and the component mounting operation of mounting the component on circuit board 12.

Further, when production in accordance with the production job (production program) is started, control device 45 of each component mounting machine 10 of the component mounting line controls operations of two XY-robots 14L and 14R, picks up backup pins 51 stored in stock areas SL and SR of backup plate 56, and performs the automatic backup pin arrangement operation at the position designated in the production job in backup plate 56, and then starts the production.

The arrangement of backup pins 51 designated in the production job is commonly used by multiple component mounting machines 10 constituting the component mounting line, and the position of backup pins 51 is designated at a position relative to circuit board 12. This is because, as illustrated in FIG. 5, a conveyance stop position of circuit board 12 may differ from for each component mounting machine 10.

Incidentally, as illustrated in FIG. 5, since movable areas AL and AR in which two XY-robots 14L and 14R of each component mounting machine 10 can move are located apart in X-direction, which is the conveyance direction of circuit board 12, area M exists outside the movement range between movable areas AL and AR of two XY-robots 14L and 14R. Since the component mounting operation and the automatic backup pin arrangement operation can be performed only in movable areas AL and AR, in a case where each component mounting machine 10 stops the conveyance of circuit board 12 at a position straddling area M outside the movement range and mounts the components on circuit board 12 by two XY-robots 14L and 14R, as illustrated in FIG. 5, a relative positional relationship between circuit board 12 and area M outside the movement range is changed by changing the conveyance stop position of circuit board 12 for each component mounting machine 10 to change the mountable area of circuit board 12 for each component mounting machine 10, so that the components are mounted.

Since each component mounting machine 10 cannot automatically arrange backup pins 51 in area M outside the movement range, control device 45 of each component mounting machine 10 determines whether backup pin 51 exists at a position corresponding to area M outside the movement range in the arrangement of backup pins 51 designated in the production job in consideration of the relative positional relationship between the conveyance stop position of circuit board 12 and area M outside the movement range, and in a case where backup pin 51 exists at the position corresponding to area M outside the movement range, excludes backup pin 51 at the position from the arrangement of backup pins 51 designated in the production job not to be automatically arranged while remaining backup pin 51 in stock areas SL and SR, takes out only other backup pins 51 from stock areas SL and SR, and automatically arranges only other backup pins 51 at the positions designated in the production job.

Incidentally, it is necessary to change the arrangement of backup pins 51 whenever the production job for changing the size, the shape, or the like of circuit board 12 on which the component is mounted is switched, the number of backup pins 51 to be used is increased or decreased by the change of the arrangement of backup pins 51, and thereby the number of backup pins 51 (unused backup pins 51) to be left in stock areas SL and SR is also increased or decreased.

In addition, stock areas SL and SR on backup plate 56 may be narrowed depending on the size or the shape of circuit board 12 when the production job is switched, and when stock areas SL and SR are narrowed, the number of backup pins 51 that can be stored in stock areas SL and SR decreases. Therefore, the number of unused backup pins 51 may be larger than the number of backup pins 51 that can be stored in stock areas SL and SR.

Accordingly, in the present embodiment, in a case where there is no free space where unnecessary backup pins 51 removed from backup plate 56 are retracted to stock areas SL and SR when the production job is switched for changing the arrangement of backup pins 51 (that is, in a case where the number of unused backup pins 51 is larger than the number of backup pins 51 that can be stored in stock areas SL and SR), at least a part of the region of backup plate 56 facing the lower surface of circuit board 12, which does not interfere with the mounted component on the lower surface side of circuit board 12, is used as retraction area T and unnecessary backup pins 51 that cannot be retracted to stock areas SL and SR are retracted to retraction area T.

In order to realize the retraction operation of unnecessary backup pins 51 to retraction area T, in the present embodiment, control device 45 of each component mounting machine 10 of the component mounting line acquires information on the mounted component on the lower surface side of circuit board 12 and information on stock areas SL and SR from a production management computer (not illustrated) that manages the production of each component mounting machine 10 of the component mounting line, determines whether there is a free space where unnecessary backup pins 51 removed from on backup plate 56 are retracted to stock areas SL and SR, and controls operations of XY-robots 14L and 14R so as to retract unnecessary backup pins 51 that cannot be retracted to stock areas SL and SR, to retraction area T in a case where there is no free space.

Alternatively, retraction destination information for designating which area of stock areas SL and SR or retraction area T unnecessary backup pins 51 is retracted to is registered in the production job, and control device 45 of each component mounting machine 10 may cause unnecessary backup pins 51 removed from backup plate 56 to be retracted to the area designated in the retraction destination information of the production job.

In this case, the retraction destination information may be registered in the production job by determining the retraction destination of unnecessary backup pin 51 by a production job optimizing device (optimizer) executing a process of optimizing the production job when the production job is created.

Alternatively, the retraction destination information may be manually registered in the production job by an operator when the production job is created.

In addition, in a case where backup pins 51 that have been retracted to retraction area T exist when the production job is switched, backup pins 51 may be picked up from retraction area T prior to stock areas SL and SR, and may be automatically arranged at positions designated in the production job.

In addition, in a case where stock areas SL and SR are narrowed by a change in the size or the shape of circuit board 12 when the production job is switched, backup pins 51 may be picked up first from the narrowed region of stock areas SL and SR, and may be automatically arranged at the positions designated in the production job.

According to the present embodiment described above, in a case where the number of backup pins 51 that is not used when the production job is switched is larger than the number of backup pins 51 that can be stored in stock areas SL and SR, at least a part of the region of backup plate 56 facing the lower surface of circuit board 12, which does not interfere with the mounted component on the lower surface side of circuit board 12, is used as the retraction area T, and the unnecessary backup pins 51 that cannot be retracted to stock areas SL and SR can be retracted to retraction area T by XY-robots 14L and 14R. Therefore, it is unnecessary for the operator to remove unnecessary backup pins 51 from backup plate 56 when the production job is switched, which eliminates the need for a troublesome operation to store the same in the spare stock area provided in another place other than backup plate 56, so that the productivity can be improved.

Since component mounting machine 10 of the present embodiment includes two XY-robots 14L and 14R, movable areas AL and AR in which two XY-robots 14L and 14R can move are located apart in X-direction that is the conveyance direction of circuit board 12, and area M outside the movement range exists between movable areas AL and AR of two XY-robots 14L and 14R, there is a tendency that the number of backup pins 51 not used when the production job is switched increases, and a possibility that the number of backup pins 51 not used when the production job is switched is larger than the number of backup pins 51 that can be stored in stock areas SL and SR can be increased in comparison with a component mounting machine including only one XY-robot. Therefore, as in the present embodiment, when the present disclosure is applied to component mounting machine 10 including two XY-robots 14L and 14R, a significant effect on the improvement of the productivity can be obtained.

However, it is needless to say that the present disclosure may be applied to a component mounting machine including only one XY-robot.

In addition, the present disclosure is not limited to the above embodiment, and it is needless to say that the present disclosure can be practiced by various modifications without departing from the gist thereof, for example, two conveyors are arranged in parallel in each component mounting machine, the backup pins may be automatically arranged on two circuit boards loaded in each component mounting machine to mount the components on the two circuit boards, the configuration of backup pin 51 may be changed, or the like.

REFERENCE SIGNS LIST

10 . . . component mounting machine, 11 . . . conveyor, 12 . . . circuit board, 13L, 13R . . . mounting head, 14L, 14R . . . XY-robot, 15L, 15R . . . X-slide, 16L, 16R . . . Y-slide, 17L, 17R . . . X-axis driving device, 18 . . . suction nozzle, 19L, 19R . . . Z-axis driving device, 21L, 21R . . . linear motor, 31 . . . mounting machine body, 32 . . . component supply device, 45 . . . control device, 51 . . . backup pin, 56 . . . backup plate, AL, AR . . . movable area, M . . . area outside movement range, SL, SR . . . stock area, T . . . retraction area

The invention claimed is:

1. An automatic backup pin arrangement system for a component mounting machine, comprising:
  a backup plate on which backup pins are placed, the backup pins holding, from below, a circuit board on which a component is mounted;
  an XY-robot configured to perform a component mounting operation of mounting the component on the circuit board and an automatic backup pin arrangement operation of automatically arranging the backup pins on the backup plate; and
  a control device configured to control an operation of the XY-robot,
  wherein the control device is configured to control the XY-robot to
    use at least a part of a region of the backup plate not facing a lower surface of the circuit board, as a stock area for storing the backup pins,
    pick up the backup pins stored in the stock area, and
    automatically arrange the backup pins at positions of the backup plate designated in a production job, and
  the control device is configured to change the arrangement of the backup pins by
    acquiring information on the mounted component on a lower surface side of the circuit board when the production job is switched,
    determining whether there is a free space where the unnecessary backup pin removed from the backup plate is retracted to the stock area, and
    when it is determined that there is no free space where an unnecessary backup pin removed from the backup plate is retracted to the stock area, controlling the XY-robot to
      use as a retraction area, at least a part of a region of the backup plate facing a lower surface of the circuit board, which does not interfere with a mounted component on a lower surface side of the circuit board, and
      retract the unnecessary backup pin that cannot be retracted to the stock area to the retraction area.

2. The automatic backup pin arrangement system for a component mounting machine according to claim 1,
wherein the control device configured to acquire the information on the mounted component on the lower surface side of the circuit board from a production management computer that manages production of the component mounting machine.

3. The automatic backup pin arrangement system for a component mounting machine according to claim 1,
wherein control device is configured to control the XY-robot to retract the unnecessary backup pin to an area of the stock area and the retraction area designated in retraction destination information based on the production job.

4. The automatic backup pin arrangement system for a component mounting machine according to claim 1,
wherein, when the backup pin that has been retracted to the retraction area already exists when the production job is switched, the control device is configured to control the XY-robot to pick up the backup pins from the retraction area prior to the stock area, and to automatically arrange the backup pins at the positions designated in the production job.

5. The automatic backup pin arrangement system for a component mounting machine according to claim 1,
wherein when the stock area is narrowed by a change in a size or a shape of the circuit board when the production job is switched the control device is configured to control the XY-robot to pick up the backup pins first from a narrowed region of the stock area, and to automatically arrange the backup pins at the positions designated in the production job.

* * * * *